(12) United States Patent
Shamee et al.

(10) Patent No.: US 11,216,251 B2
(45) Date of Patent: Jan. 4, 2022

(54) WIDEBAND PHOTONIC RADIO FREQUENCY (RF) NOISE GENERATOR

(71) Applicant: Raytheon Company, Waltham, MA (US)

(72) Inventors: Bishara Shamee, Playa Del Rey, CA (US); Steven R. Wilkinson, Stevenson Ranch, CA (US)

(73) Assignee: Raytheon Company, Waltham, MA (US)

( * ) Notice: Subject to any disclaimer, the term of this patent is extended or adjusted under 35 U.S.C. 154(b) by 185 days.

(21) Appl. No.: 16/359,248

(22) Filed: Mar. 20, 2019

(65) Prior Publication Data

US 2020/0304228 A1 Sep. 24, 2020

(51) Int. Cl.
*G06F 7/58* (2006.01)
*H04B 10/50* (2013.01)
(Continued)

(52) U.S. Cl.
CPC ............ *G06F 7/588* (2013.01); *H04B 10/502* (2013.01); *H04B 10/697* (2013.01);
(Continued)

(58) Field of Classification Search
CPC ....... G06F 7/58–588; H03M 1/00–089; H04B 10/00–0799; G02B 27/56
See application file for complete search history.

(56) References Cited

U.S. PATENT DOCUMENTS

| | | |
|---|---|---|
| 5,444,447 A | 8/1995 | Wingender |
| 5,598,288 A | 1/1997 | Collar |

(Continued)

FOREIGN PATENT DOCUMENTS

| | | |
|---|---|---|
| EP | 2909712 A2 | 8/2015 |
| EP | 3370353 A1 | 9/2018 |

(Continued)

OTHER PUBLICATIONS

Lim, C. on "Limiters Protect ADCs without Adding Harmonics", Jan. 2014. Retrieve on [Nov. 24, 2020], Retrieve from the Internet <https://www.mwrf.com/technologies/passive-components/article/21846045/limiters-protect-adcs-without-adding-harmonics> (Year: 2014).*

(Continued)

*Primary Examiner* — Aimee Li
*Assistant Examiner* — Carlo Waje
(74) *Attorney, Agent, or Firm* — Schwegman Lundberg & Woessner, P.A.

(57) ABSTRACT

A photonic random signal generator includes an incoherent optical source configured to generate an optical noise signal, a filter configured to generate a filtered optical noise signal using the optical noise signal, a coupler, a photodetector, a filter, and a limiter. The coupler couples the filtered optical noise signal and a delayed version of the filtered optical noise signal to generate a first coupled signal and a second coupled signal. The photodetector generates an output signal representative of a phase difference between the filtered optical noise signal and the delayed version of the filtered optical noise signal using the first coupled signal and the second coupled signal. The filter filters the output signal representative of the phase difference to generate an analog random signal. The limiter thresholds the analog random signal based on a clock signal, to generate a digital random signal.

18 Claims, 8 Drawing Sheets

(51) Int. Cl.
*H04B 10/69* (2013.01)
*H04K 3/00* (2006.01)

(52) U.S. Cl.
CPC ........... *H04B 10/6932* (2013.01); *H04K 3/42* (2013.01); *H04K 3/46* (2013.01)

(56) References Cited

U.S. PATENT DOCUMENTS

| | | | |
|---|---|---|---|
| 6,002,480 A | 12/1999 | Izatt et al. | |
| 6,118,397 A | 9/2000 | Heflinger | |
| 6,195,669 B1* | 2/2001 | Onodera | G06F 7/588 708/250 |
| 6,218,973 B1* | 4/2001 | Barrett, Jr. | G06F 7/588 341/143 |
| 6,448,921 B1 | 9/2002 | Tsui et al. | |
| 6,476,949 B1 | 11/2002 | Loh et al. | |
| 6,704,511 B1 | 3/2004 | Kerfoot, III et al. | |
| 7,253,755 B1 | 8/2007 | Fette | |
| 7,406,304 B2 | 7/2008 | Busson et al. | |
| 7,423,564 B2 | 9/2008 | Kitayama et al. | |
| 7,973,688 B2 | 7/2011 | Huang et al. | |
| 8,699,882 B2 | 4/2014 | Shieh | |
| 8,738,956 B2 | 5/2014 | Chen et al. | |
| 8,965,211 B1 | 2/2015 | Zanoni et al. | |
| 9,608,653 B2 | 3/2017 | Le Dortz et al. | |
| 9,768,873 B2 | 9/2017 | Hajimiri et al. | |
| 9,843,398 B1 | 12/2017 | Zanoni et al. | |
| 9,900,096 B2 | 2/2018 | Hajimiri et al. | |
| 9,916,132 B2* | 3/2018 | Yuan | G06F 7/588 |
| 10,019,235 B2* | 7/2018 | Nordholt | H04L 9/0852 |
| 10,038,498 B1 | 7/2018 | Fan et al. | |
| 10,090,847 B1 | 10/2018 | Robinson et al. | |
| 10,205,535 B1 | 2/2019 | Baehr-jones | |
| 10,298,256 B1 | 5/2019 | Robinson et al. | |
| 10,700,700 B1 | 6/2020 | Shamee et al. | |
| 10,727,862 B1 | 7/2020 | Shamee et al. | |
| 10,833,768 B2 | 11/2020 | Shamee et al. | |
| 2002/0164125 A1 | 11/2002 | Berger et al. | |
| 2002/0184273 A1* | 12/2002 | Katsunori | G06F 7/588 708/250 |
| 2003/0007215 A1 | 1/2003 | Snawerdt | |
| 2003/0025957 A1 | 2/2003 | Jayakumar | |
| 2003/0115028 A1 | 6/2003 | Summerfield et al. | |
| 2003/0198424 A1 | 10/2003 | Bennett | |
| 2004/0028414 A1 | 2/2004 | Quesenberry et al. | |
| 2004/0218932 A1 | 11/2004 | Epworth et al. | |
| 2005/0270202 A1 | 12/2005 | Haartsen | |
| 2006/0182209 A1 | 8/2006 | Coyne et al. | |
| 2006/0262664 A1 | 11/2006 | Imoto | |
| 2008/0031633 A1 | 2/2008 | Hoshida et al. | |
| 2008/0205886 A1 | 8/2008 | Anderson et al. | |
| 2009/0033424 A1 | 2/2009 | Nauta | |
| 2009/0047030 A1 | 2/2009 | Hoshida | |
| 2009/0136240 A1 | 5/2009 | Malouin et al. | |
| 2009/0214226 A1* | 8/2009 | Mizuguchi | H04B 10/677 398/202 |
| 2009/0317075 A1 | 12/2009 | Mandai et al. | |
| 2010/0098411 A1 | 4/2010 | Nakashima et al. | |
| 2011/0052216 A1 | 3/2011 | Jiang et al. | |
| 2011/0123192 A1 | 5/2011 | Rosenthal et al. | |
| 2011/0150503 A1 | 6/2011 | Winzer | |
| 2012/0045053 A1* | 2/2012 | Qi | G06F 7/588 380/252 |
| 2012/0212360 A1 | 8/2012 | Kanter et al. | |
| 2012/0213531 A1 | 8/2012 | Nazarathy et al. | |
| 2013/0057421 A1* | 3/2013 | Aruga | H03M 3/02 341/143 |
| 2013/0058647 A1 | 3/2013 | Boertjes et al. | |
| 2013/0207820 A1* | 8/2013 | Maurino | H03M 3/30 341/131 |
| 2013/0216239 A1 | 8/2013 | Zhang et al. | |
| 2014/0016168 A1* | 1/2014 | Marandi | G06N 10/00 359/107 |
| 2014/0186033 A1 | 7/2014 | Winzer et al. | |
| 2014/0337400 A1* | 11/2014 | Chong | G01J 1/0425 708/255 |
| 2015/0154007 A1 | 6/2015 | Sussman et al. | |
| 2016/0173202 A1 | 6/2016 | Kelly | |
| 2016/0204875 A1 | 7/2016 | Araki et al. | |
| 2016/0204876 A1 | 7/2016 | Kamura et al. | |
| 2016/0328211 A1* | 11/2016 | Nordholt | G06F 7/588 |
| 2017/0237500 A1 | 8/2017 | Nishimoto | |
| 2017/0322520 A1* | 11/2017 | Wu | H03M 1/50 |
| 2018/0006732 A1 | 1/2018 | Pang et al. | |
| 2018/0074348 A1 | 3/2018 | Fujita et al. | |
| 2018/0198533 A1 | 7/2018 | Zhou et al. | |
| 2018/0269964 A1 | 9/2018 | Mertz et al. | |
| 2019/0050203 A1* | 2/2019 | Qi | H04L 9/0852 |
| 2019/0369965 A1* | 12/2019 | Choi | G06F 7/588 |
| 2019/0393675 A1* | 12/2019 | Marangon | H01S 5/0078 |
| 2020/0125332 A1* | 4/2020 | Pooser | G01J 1/0425 |
| 2020/0266827 A1* | 8/2020 | Sauerbrey | H03M 3/32 |
| 2020/0030421 A1 | 9/2020 | Shamee et al. | |
| 2020/0285447 A1* | 9/2020 | Kozato | G06F 7/588 |

FOREIGN PATENT DOCUMENTS

| | | |
|---|---|---|
| WO | WO-0075721 A1 | 12/2000 |
| WO | WO-2012073243 A1 | 6/2012 |
| WO | WO-2017019507 A1 | 2/2017 |
| WO | WO-2020190355 A1 | 9/2020 |
| WO | WO-2020190943 A1 | 9/2020 |
| WO | WO-2020190947 A1 | 9/2020 |
| WO | WO-2020190950 A1 | 9/2020 |

OTHER PUBLICATIONS

P. P. Sotiriadis and N. Stamatopoulos, "Dynamic range Vs spectral clarity trade-off in all-digital frequency synthesis via single-bit sinewave quantization," 2013, pp. 708-711, doi: 10.1109/EFTF-IFC.2013.6702181. (Year: 2013).*

J. Yang et al., "Highly Uniform White Light-Based Visible Light Communication Using Red, Green, and Blue Laser Diodes," in IEEE Photonics Journal, vol. 10, No. 2, pp. 1-8, Apr. 2018, Art No. 8200508, doi: 10.1109/JPHOT.2018.2802933. (Year: 2018).*

P. P. Sotiriadis and N. Stamatopoulos, "All-digital frequency synthesis based on single-bit Nyquist-rate sinewave quantization with IID random dithering," 2013, pp. 213-216, doi: 10.1109/EFTF-IFC.2013.6702179. (Year: 2013).*

"U.S. Appl. No. 16/359,229, Non Final Office Action dated Sep. 30, 2019", 12 pgs.

"U.S. Appl. No. 16 359,234, Non Final Office Action dated Oct. 1, 2019", 12 pgs.

"U.S. Appl. No. 16/359,229, Response filed Dec. 30, 2019 to Non Final Office Action dated Sep. 30, 2019", 12 pgs.

Aziz, P. M., et al., "An Overview of Sigma-Delta Converters", IEEE Signal Processing Magazine, (Jan. 1996), 61-84.

Cvetkovic, Zoran, et al., "Single-Bit Oversampled A/D Conversion With Exponential Accuracy in the Bit Rate", IEEE Transactions on Information Theory, vol. 53, No. 11, (2007), 3979-3989.

Dabeer, Onkar, et al., "Signal Parameter Estimation Using 1-Bit Dithered Quantization", IEEE Transactions on Information Theory, vol. 52, No. 12,, (Dec. 2006), 5389-5405.

Qi, Bing, et al., "High-speed quantum random number generation by measuring phase noise of a single-mode laser", Optics Letters / vol. 35, No. 3, (Feb. 2010), 312-314.

Roberts, Lawrence, "Picture Coding Using Pseudo-Random Noise", IRE Transactions on Information Theory, (1962), 145-154.

Rodenbeck, Christopher, et al., "Monobit Subsampler for Digital Downconversion in Pulse-Doppler Radar Applications", IEEE Transactions on Microwave Theory and Techniques, vol. 57, No. 5, (2009), 1036-1043.

Sinem, Ergen, et al., "Effect of Analog-to Digital Converter in Distributed Sampling for Sensor Networks", (2005), 8 pgs.

Valley, George C, "Photonic analog-to-digital converters", Optics Express, vol. 15, No. 5, [Online] Retrieved from the internet: <https://pdfs.semanticscholar.org/a868/e2d948b01cef975868088cf23flf0c2041f2.pdf>, (2007), 28 pgs.

(56) References Cited

OTHER PUBLICATIONS

Wang, Zhiyong, et al., "Monobit Digital Receivers for QPSK: Design, Performance and Impact of IQ Imbalances", arXiv:1202.6141v3 [cs.IT], (2013), 29 pgs.

Wannamaker, Rob, "A theory of Non-Subtractive Dither", IEEE Transactions on Signal Processing 48(2):499-516, (2000), 56 pgs.

"U.S. Appl. No. 16/359,229, Notice of Allowability dated May 1, 2020", 2 pgs.

"U.S. Appl. No. 16/359,229, Notice of Allowability dated Jun. 30, 2020", 2 pgs.

"U.S. Appl. No. 16/359,229, Notice of Allowance dated Mar. 13, 2020", 9 pgs.

"U.S. Appl. No. 16/359,234, Notice of Allowability dated May 1, 2020", 2 pgs.

"U.S. Appl. No. 16/359,234, Notice of Allowability dated Jun. 1, 2020", 2 pgs.

"U.S. Appl. No. 16/359,234, Notice of Allowance dated Mar. 13, 2020", 10 pgs.

"U.S. Appl. No. 16/359,234, Response filed Jan. 2, 2020 to Non Final Office Action dated Oct. 1, 2019", 13 pgs.

"U.S. Appl. No. 16/359,263, Non Final Office Action dated Feb. 18, 2020", 22 pgs.

"U.S. Appl. No. 16/359,263, Notice of Allowability dated Sep. 30, 2020", 2 pgs.

"U.S. Appl. No. 16/359,263, Notice of Allowance dated Jul. 1, 2020", 9 pgs.

"U.S. Appl. No. 16/359,263, Response filed May 18, 2020 to Non Final Office Action dated Feb. 18, 2020", 11 pgs.

"International Application Serial No. PCT/US2020/012547, International Search Report dated May 4, 2020", 5 pgs.

"International Application Serial No. PCT/US2020/012547, Written Opinion dated May 4, 2020", 7 pgs.

"International Application Serial No. PCT/US2020/023151, International Search Report dated Jun. 9, 2020", 4 pgs.

"international Application Serial No. PCT/US2020/023151, Written Opinion dated Jun. 9, 2020", 7 pgs.

"International Application Serial No. PCT/US2020/023158, International Search Report dated Jun. 12, 2020", 4 pgs.

"International Application Serial No. PCT/US2020/023158, Written Opinion dated Jun. 12, 2020", 7 pgs.

"International Application Serial No. PCT/US2020/023164, International Search Report dated Jul. 2, 2020", 5 pgs.

"International Application Serial No. PCT/US2020/023164, Written Opinion dated Jul. 2, 2020", 7 pgs.

"White Noise", Wikipedia, (2017).

Ajmal, T, et al., "Design of a 10Gbps Optical Burst mode DPSK Receiver for Data and Clock Recovery", ECOC2008, ECOC, Brussels, ECOC, Brussels Expo, Belgium, (Sep. 21, 2008), 2 pgs.

Deshpande, "Electron Devices & Circuits: Principles and Applications", Tata McGraw-Hill Education, (2008), 125-126.

Kakande, et al., "QPSK Phase and Amplitude Regeneration at 56 Gbaud in a Novel Idler-Free Non-Degenerate Phase Sensitive Amplifier", OSA, (2011), 3 pgs.

Kaminov, et al., "Optical Fiber Telecommunications vol. VIB: Systems and Network", Academic Press, (2013), 932-934.

Khilo, Anatol, et al., "Photonic ADC: overcoming the bottleneck of electronic jitter", Optics Express, vol. 20, No. 4, (Feb. 13, 2012), 4454 pgs.

Malouin, Christian, et al., "Differential Phase-Shift Keying Receiver Design Applied to Strong Optical Filtering", Journal of Lightwave Technology, IEEE, USA, vol. 25. No. 11, (Nov. 1, 2007), 3536-3542.

Yamada, Yoshiaki, et al., "High-Level Fluctuation Tolerant Optical Receiver for Optical Packet Switch and WDM Cross-Connect", Journal of Lightwave Technology, IEEE, USA, vol. 16, No. 12, (Dec. 1, 1998), 2220-2227.

* cited by examiner

WIDEBAND PHOTONIC RADIO FREQUENCY (RF) NOISE GENERATOR

TECHNICAL FIELD OF THE DISCLOSURE

The present disclosure relates to noise generators and analog-to-digital converters (ADCs). More specifically, the present disclosure relates to a wideband photonic radio frequency (RF) noise generator. Some aspects of the present disclosure relate to non-subtractive dither ADCs using a wideband photonic RF noise generator. Further aspects of the present disclosure relate to a monobit ADC using a wideband photonic RF noise generator. Yet additional aspects of the present disclosure relate to subtractive dither ADCs using a wideband photonic RF noise generator.

BACKGROUND OF THE DISCLOSURE

As communication systems evolve over time, digital data rates tend to increase. As a result, there is an ongoing effort to increase the speed and accuracy of analog-to-digital conversion to support the increase in communication rates.

High bandwidth and high spur-free dynamic range analog-to-digital conversion is a common desire across multiple domains but is difficult to achieve. With the advent of photonics, the analog-to-digital conversion can be improved beyond the electronic conversion by harvesting the photonics bandwidth and balancing the functional partition between electronics and photonics.

BRIEF DESCRIPTION OF THE DRAWINGS

Corresponding reference characters indicate corresponding parts throughout the several views. Elements in the drawings are not necessarily drawn to scale. The configurations shown in the drawings are merely examples and should not be construed as limiting the scope of the invention in any manner.

DETAILED DESCRIPTION

The following description and the drawings sufficiently illustrate aspects to enable those skilled in the art to practice them. Other aspects may incorporate structural, logical, electrical, process, and other changes. Portions and features of some aspects may be included in or substituted for, those of other aspects. Aspects set forth in the claims encompass all available equivalents of those claims.

Techniques disclosed herein can be used to realize a wideband photonic RF noise generator using an incoherent optical source. Since incoherent optical sources have random phase, by adding a delay line interferometer into the signal path, a phase difference can be obtained between the delayed signal and the non-delayed signal, with the phase difference resulting in a uniform random number. In some aspects, the detected phase difference can be filtered to obtain a wideband analog random signal. The analog random signal can be further limited to obtain a digital random signal output. In this regard, analog and digital random signals can be generated based on the incoherent optical source.

Figure 1:
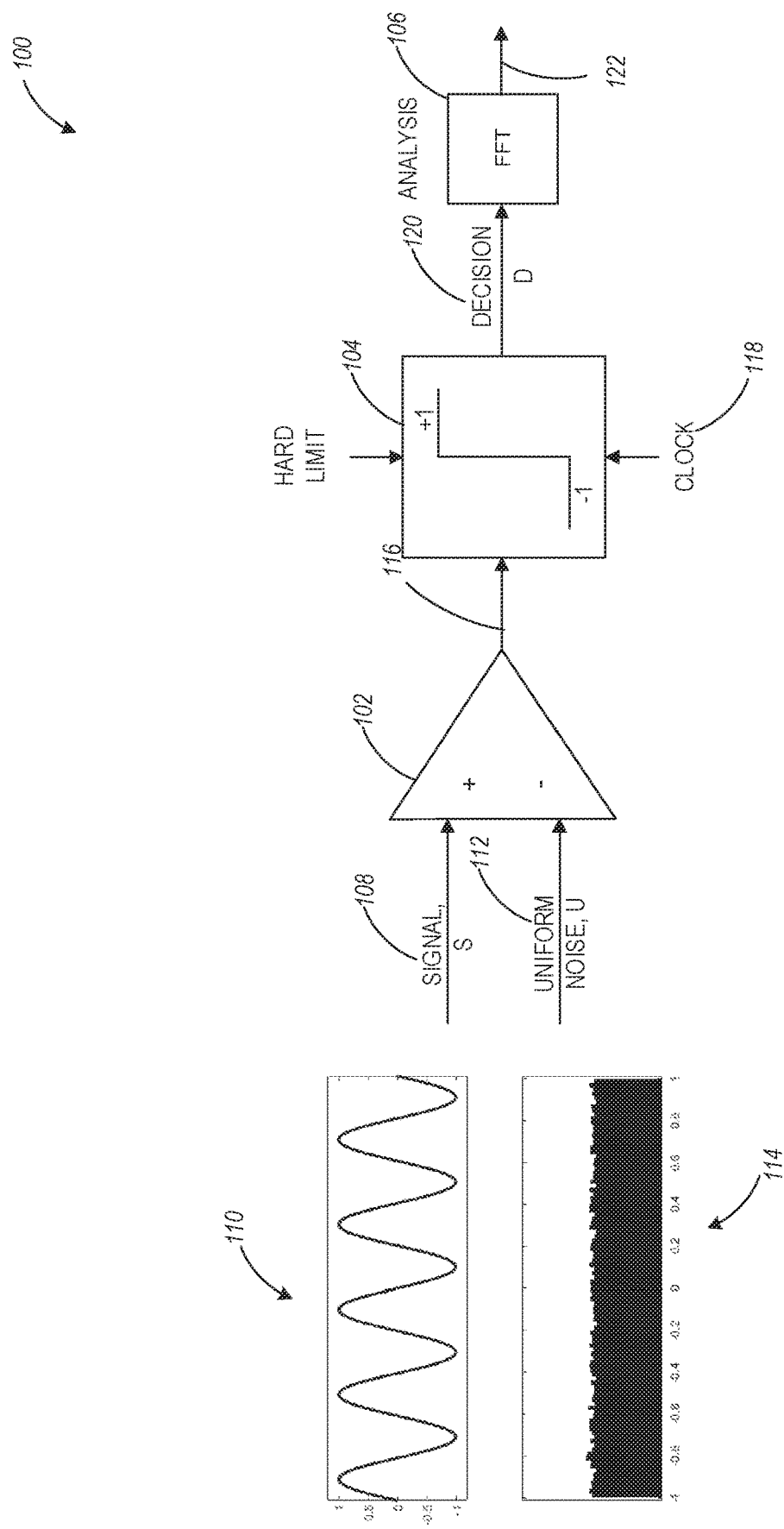
FIG. 1 illustrates a conceptual block diagram of a monobit ADC, in accordance with some aspects.

FIG. 1 illustrates a conceptual block diagram of a monobit ADC 100, in accordance with some aspects. Electronic monobit ADCs convert an analog signal to its digital representation based on dithering an input signal with uniform noise. Referring to FIG. 1, the monobit ADC 100 can include a comparator 102 and a limiter 104. The comparator 102 is configured to receive an analog input signal (S) 108 and a uniform noise signal (U) 112. The analog input signal 108 can have a signal profile as illustrated in graph 110, and the uniform noise signal 112 can have a noise distribution as illustrated in graph 114.

The comparator 102 compares the analog input signal 108 with the uniform noise signal 112 to generate a comparison result 116. The limiter 104 is configured to receive a clock signal 118 and the comparison result 116, and hard limit the comparison result to +1 (if the comparison result is positive indicating that signal 108 is greater than the noise) or −1 (if the comparison result is negative indicating that the noise is greater than signal 108). The limiter 104 outputs a decision signal (D) 120, with the expected value (or average) of the limiter output signal D 120 being a digital signal representation 122 of the analog input signal 108, after processing with a filter (e.g., in a digital signal processing block or a Fourier frequency transform (FFT) block such as FFT block 106).

One of the main limitations of analog-to-digital conversion at higher rates is the introduced spurs of undesired tones resulting from realization imperfections. A significant advantage of the monobit ADC architecture is the high spurious-free dynamic range (SFDR) resulting from the dithering (or applying uniform noise to) the input signal.

In some aspects, techniques disclosed herein can be used for generating a digital random signal for driving monobit ADCs without uniform noise.

Figure 2:
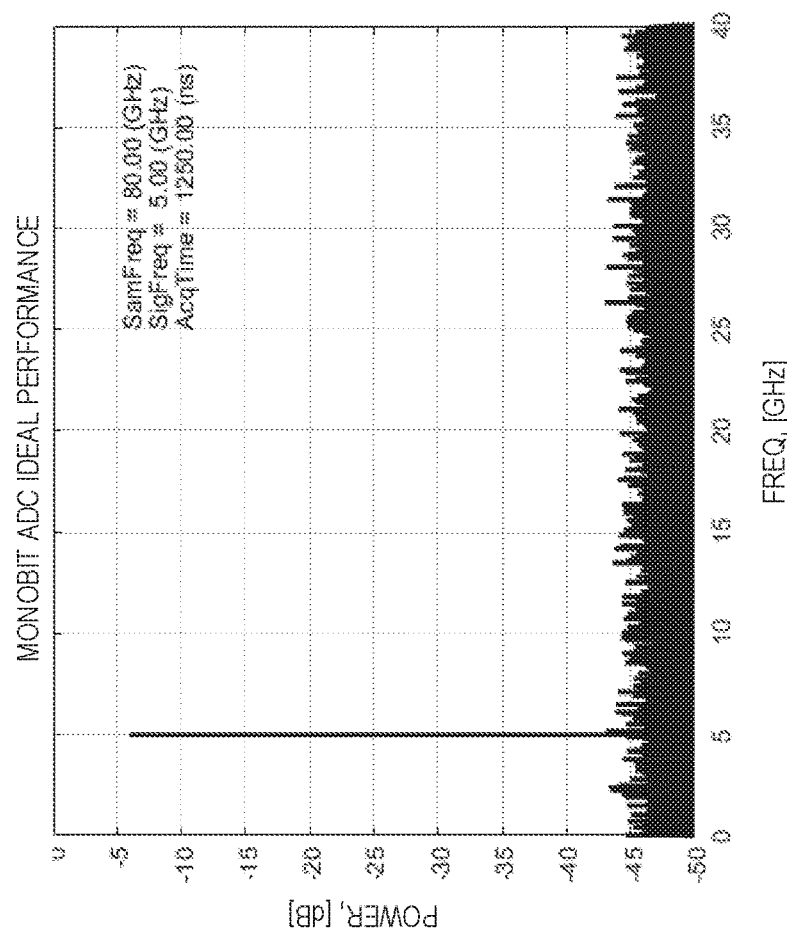
FIG. 2 is a graphical representation illustrating a frequency Fourier transform (FFT) magnitude of a tone based on the monobit ADC of FIG. 1.

FIG. 2 is a graphical representation 200 illustrating a frequency Fourier transform (FFT) magnitude of a tone based on the monobit ADC 100 of FIG. 1. FIG. 2 is illustrative of the spur free range of monobit conversion. More specifically, FIG. 2 illustrates the frequency and power profile of a tone at 5 GHz that is sampled at 80 GHz with an acquisition time of 1.25 µs. The spurs appear relatively at the same power level as illustrated by the FFT of the limiter output.

Some techniques for implementing electronic monobit conversion can rely on generating digital pseudo-random noise, which can consume a large portion of the ASIC power and can be a limiting factor as the sampling rates and signals increase. One of the advantages of photonics is its bandwidth and relative efficiency. In this regard, techniques disclosed herein can be used to realize a photonic monobit ADC, based on a modulator that modulates the electrical signal onto an optical carrier to be compared with an incoherent wide bandwidth noise source, as discussed hereinbelow.

Figure 3A:
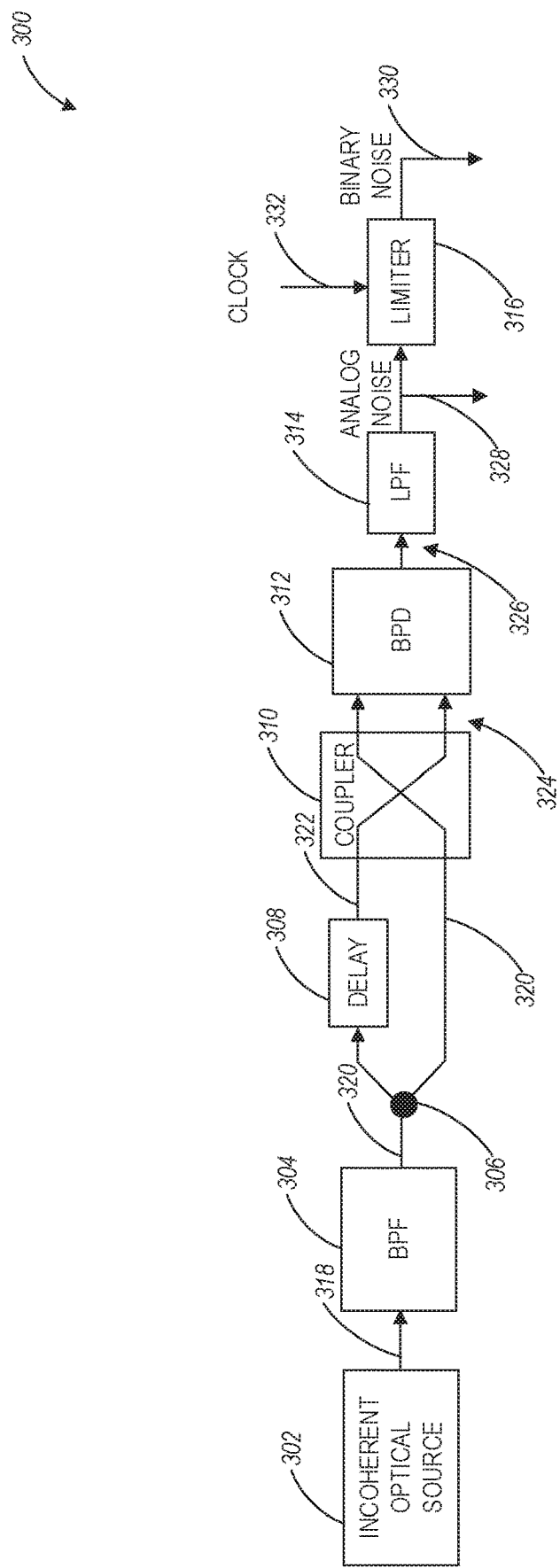
FIG. 3A is a block diagram of a photonic RF noise generator, in accordance with some aspects.

FIG. 3A is a block diagram of a photonic RF noise generator, in accordance with some aspects. Referring to FIG. 3A, the photonic RF noise generator 300 can include an optical source 302, a filter 304, a splitter 306, a delay circuit 308, a coupler 310, a balanced photodetector (BPD) 312, a filter 314, and a limiter 316.

Figure 3B:
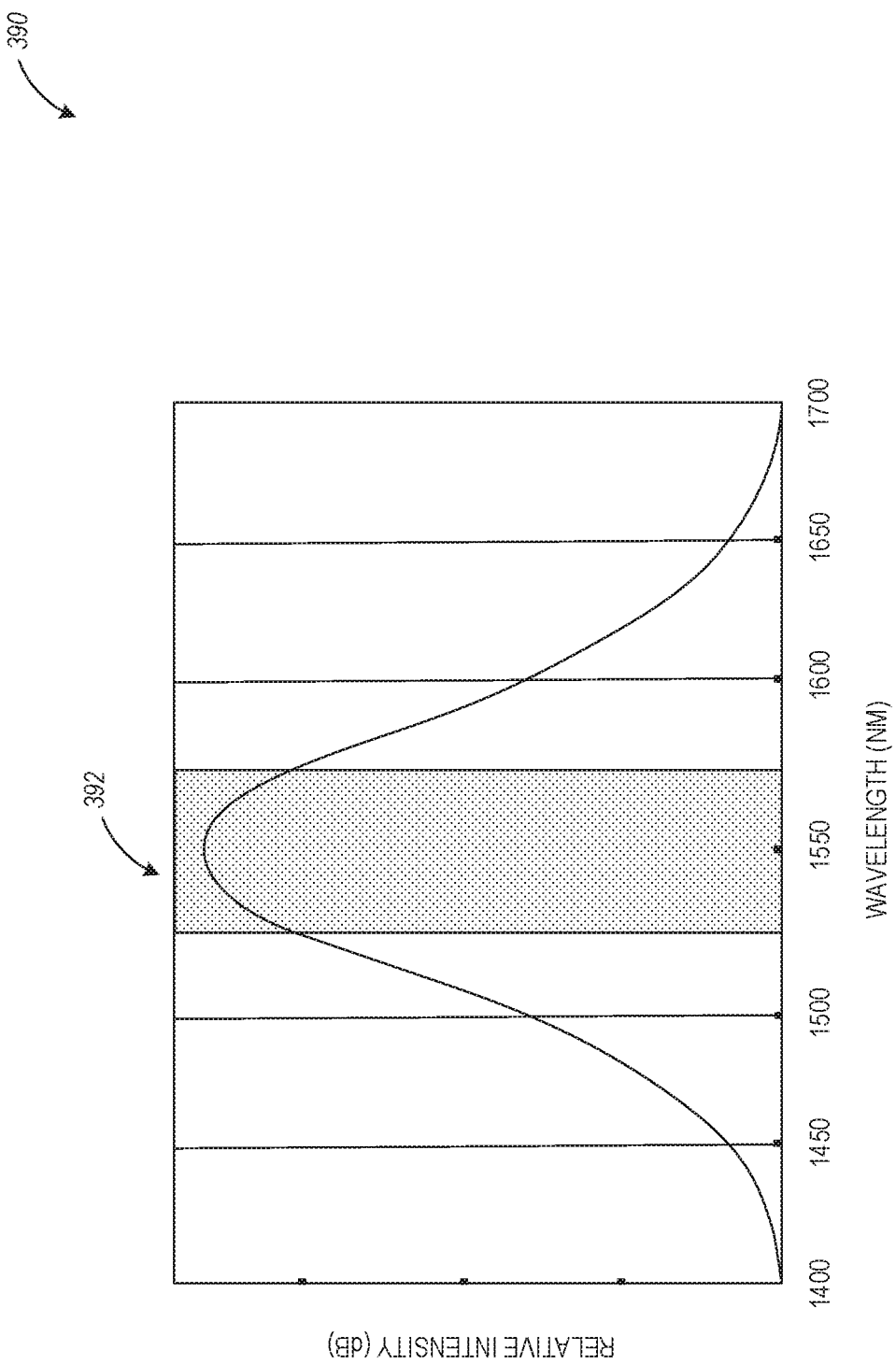
FIG. 3B is a graphical spectral representation of the noise signal from an incoherent optical source used in connection with the photonic RF noise generator of FIG. 3A, in accordance with some aspects.

The optical source 302 can be an incoherent signal source generating an optical or photonic noise signal 318, where the signal phases are random and uniformly distributed over the range of the signal, from sample to sample, with low correlation existing between any two samples. FIG. 3B is a graphical spectral representation 390 of a noise signal (e.g., 318) from the incoherent optical source 302 used in connection with the photonic RF noise generator 300 of FIG. 3A. In some aspects, the optical source 302 can be an incoherent white light emitting diode (LED) source with a high bandwidth, such as a bandwidth exceeding 1 THz, an amplified spontaneous emissions (ASE) light source, or another type of optical noise source.

As illustrated in FIG. 3A and FIG. 3B, the noise signal 318 can be filtered (e.g., by filter 304) so that a limited slice (e.g., 392 in FIG. 3B) can be selected for further processing within the photonic RF noise generator 300. In some aspects, the filter 304 can include a bandpass filter or another type of filter. The filter 304 can be configured to filter the optical noise signal 318 generated by the optical source 302, to obtain a filtered optical noise signal 320. In some aspects, the filter 304 can be a 1 nm filter that can be configured to generate a 125 GHz optical noise signal slice with a random phase samples. In some aspects, the filtered optical noise signal 320 can be centered at 1550 nm wavelength as shown in FIG. 3B, or at another desired wavelength.

The splitter 306 splits the filtered optical noise signal 320 so that one copy of the filtered optical noise signal 320 is communicated to the coupler 310 and a second copy of the filtered optical noise signal 320 is communicated to the delay circuit 308. The delay circuit 308 can be configured to apply a delay to the filtered optical noise signal 320 and generate a delayed signal 322, which is a delayed version of the filtered optical noise signal 320. In some aspects, the delay circuit 308 can be a programmable delay circuit. The delayed signal 322 and the filtered optical noise signal 320 can be communicated to coupler 310.

The coupler 310 is configured to couple the delayed signal 322 and the filtered optical noise signal 320 to generate coupled signals 324. In some aspects, one of the coupled signals 324 can be offset (e.g., by 90° from the other coupled signal.

The BPD 312 may comprise suitable circuitry, logic, interfaces and/or code and is configured to generate an electrical output signal 326 indicative of a phase difference between the delayed signal 322 and the filtered optical noise signal 320. The filter 314, which can be a low-pass filter, is configured to filter the output signal 326 indicative of the phase difference to generate an analog noise signal 328.

The limiter 316 is configured to receive the analog noise signal 328 and an electrical clock signal 332 and generate a digital noise signal 330 based on the analog noise signal 328. More specifically, the limiter 316 can be a threshold device that compares the input analog noise signal 328 to a set value (e.g., a value of 0) and generates a digital output (e.g., 0 and 1) based on whether the input analog noise signal 328 is greater than or smaller than the set value, with the clock signal 332 triggering when the comparison occurs. Different applications that use the analog noise signal 328 and or the digital noise signal 330 are discussed hereinbelow in reference to FIG. 4, FIG. 5, and FIG. 6.

Figure 4:
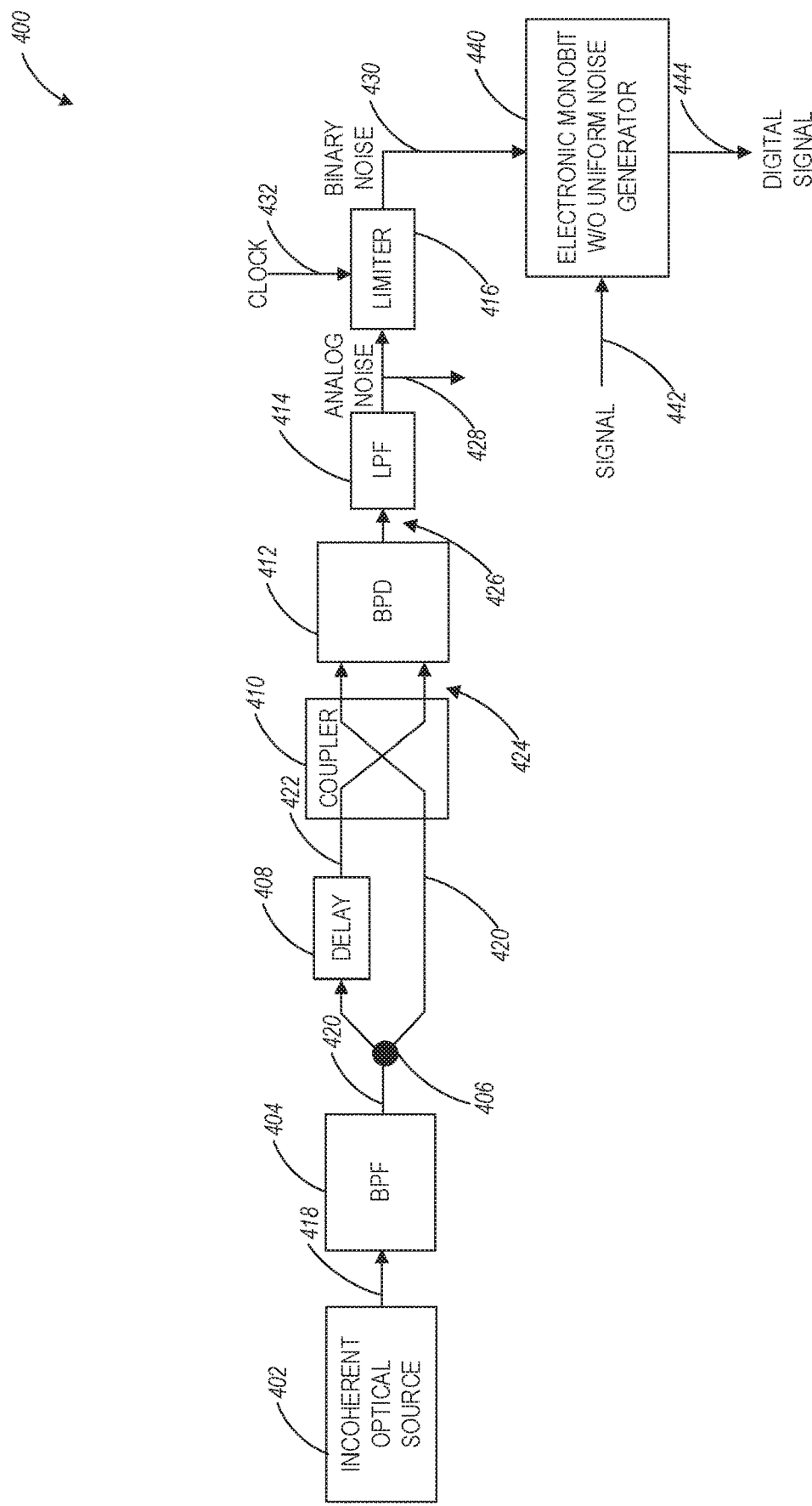
FIG. 4 is a block diagram of a photonic RF noise generator driving an electronic monobit ADC, in accordance with some aspects.

FIG. 4 is a block diagram of a photonic RF noise generator driving an electronic monobit ADC, in accordance with some aspects. Referring to FIG. 4, the photonic RF noise generator 400 can be similar to the photonic RF noise generator 300 of FIG. 3. More specifically, the photonic RE noise generator 400 includes an incoherent optical source 402, a filter 404, a splitter 406, a delay circuit 408, a coupler 410, a BPD 412, a filter 414, and a limiter 416. The functionalities of the optical source 402, the filter 404, the splitter 406, the delay circuit 408, the coupler 410, the BPD 412, the filter 414, and the limiter 416 are the same as the following corresponding circuits discussed above in connection with the RF noise generator 300 of FIG. 3: the optical source 302, the filter 304, the splitter 306, the delay circuit 308, the coupler 310, the balanced photodetector (BPD) 312, the filter 314, and the limiter 316. Additionally, signals 418, 420, 422, 424, 426, 428, 430, and 432 can be the same as corresponding signals 318, 320, 322, 324, 326, 328, 330, and 332 of FIG. 3A.

In some aspects, the photonic RF noise generator 400 can be used to drive an electronic monobit ADC 440. The electronic monobit ADC 440 can be similar to the monobit ADC 100 of FIG. 1, except that the electronic monobit ADC 440 does not utilize uniform noise. In this regard, the monobit ADC 440 can receive an input analog signal 442 and the photonically generated binary noise signal 430 to generate a digital output signal 444 representing the input analog signal 442.

Figure 5:
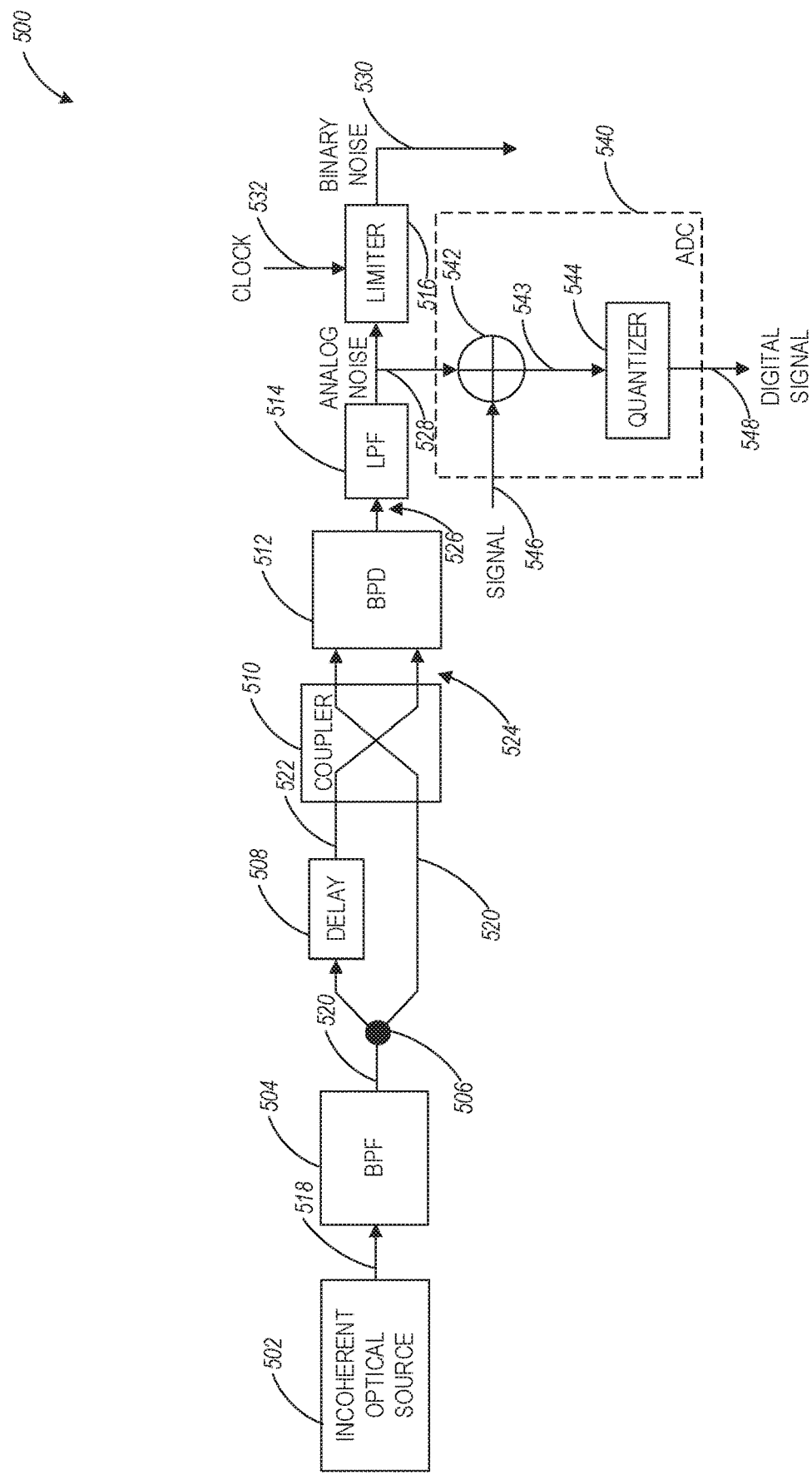
FIG. 5 is a block diagram of a photonic RF noise generator driving a non-subtractive dither ADC, in accordance with some aspects.

FIG. 5 is a block diagram of a photonic RE noise generator driving a non-subtractive dither ADC, in accordance with some aspects. Referring to FIG. 5, the photonic RF noise generator 500 can be similar to the photonic RF noise generator 300 of FIG. 3A. More specifically, the photonic RF noise generator 500 includes an optical source 502, a filter 504, a splitter 506, a delay circuit 508, a coupler 510, a BPD 512, a filter 514, and a limiter 516. The functionalities of the optical source 502, the filter 504, the splitter 506, the delay circuit 508, the coupler 510, the BPD 512, the filter 514, and the limiter 516 are the same as the following corresponding circuits discussed above in connection with the RF noise generator 300 of FIG. 3A: the optical source 302, the filter 304, the splitter 306, the delay circuit 308, the coupler 310, the balanced photodetector (BPD) 312, the filter 314, and the limiter 316. Additionally, signals 518, 520, 522, 524, 526, 528, 530, and 532 can be the same as corresponding signals 318, 320, 322, 324, 326, 328, 330, and 332 of FIG. 3A.

In some aspects, the photonic RF noise generator 500 can be used to drive a non-subtractive dither ADC 540. The non-subtractive dither ADC 540 can include an analog adder 542 and a quantizer 544. The analog adder 542 can combine an analog input signal 546 with the analog noise signal 528 to generate a combined dithered analog signal 543. The combined analog signal 543 is quantized by the quantizer 544 to generate a digital output signal 548 representing the analog input signal 546.

Figure 6:
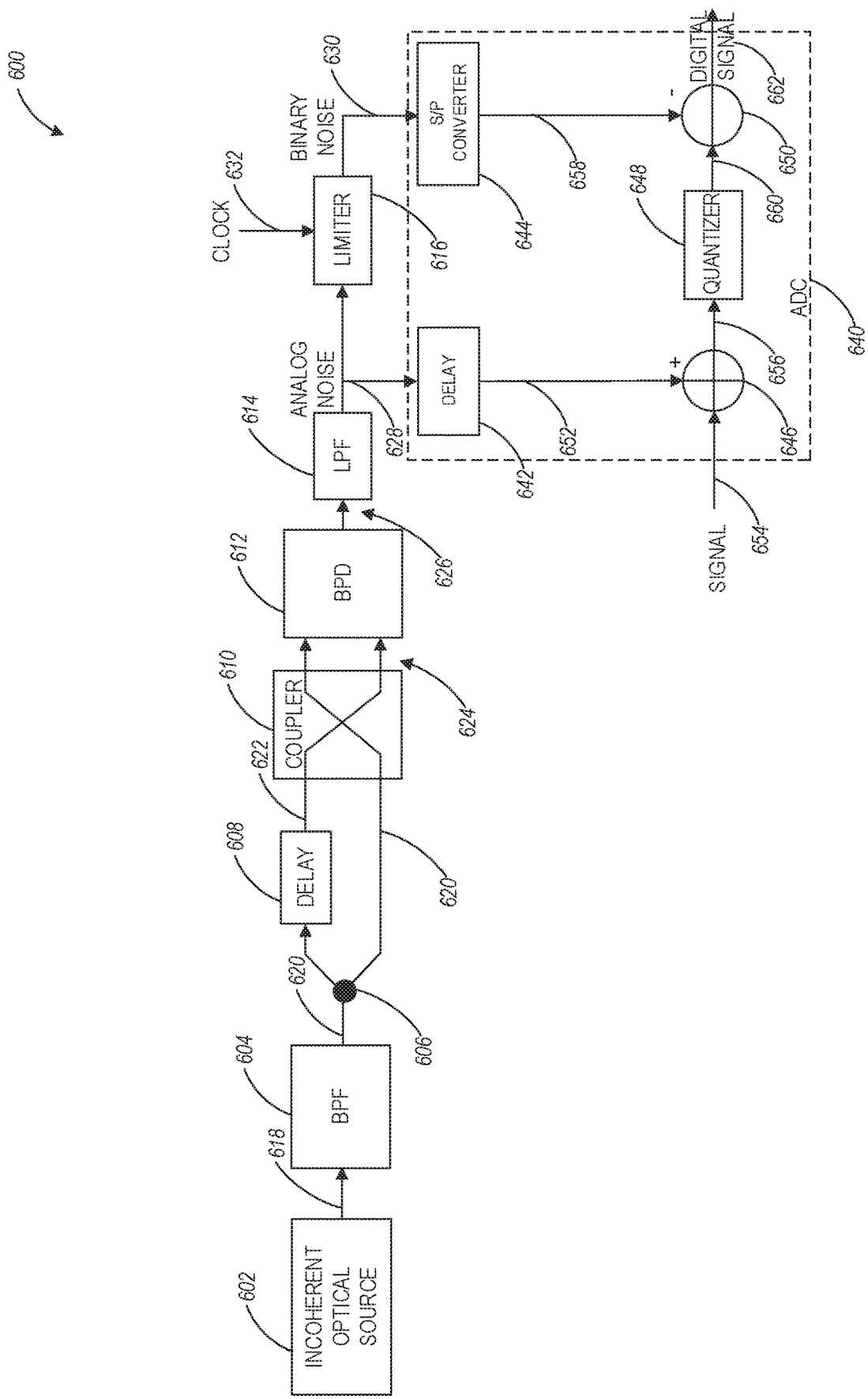
FIG. 6 is a block diagram of a photonic RF noise generator driving a subtractive dither ADC, in accordance with some aspects.

FIG. 6 is a block diagram of a photonic RF noise generator driving a subtractive dither ADC, in accordance with some aspects. Referring to FIG. 6, the photonic RF noise generator 600 can be similar to the photonic RF noise generator 300 of FIG. 3A. More specifically, the photonic RF noise generator 600 includes an optical source 602, a filter 604, a splitter 606, a delay circuit 608, a coupler 610, a BPD 612, a filter 614, and a limiter 616. The functionalities of the optical source 602, the filter 604, the splitter 606, the delay circuit 608, the coupler 610, the BPD 612, the filter 614, and the limiter 616 are the same as the following corresponding circuits discussed above in connection with the RF noise generator 300 of FIG. 3A: the optical source 302, the filter 304, the splitter 306, the delay circuit 308, the coupler 310, the balanced photodetector (BPD) 312, the filter 314, and the limiter 316. Additionally, signals 618, 620, 622, 624, 626, 628, 630, and 632 can be the same as corresponding signals 318, 320, 322, 324, 326, 328, 330, and 332 of FIG. 3A.

In some aspects, the photonic RF noise generator 600 can be used to drive a subtractive dither ADC 640. The subtractive dither ADC 640 can include a delay circuit 642, an analog adder 646, a digital adder 650, a quantizer 648, and a serial-to-parallel converter 644. The delay circuit 642 is configured to delay the analog noise signal 628 to generate a delayed analog noise signal 652. The converter 644 is configured to apply serial-to-parallel conversion to the digital noise signal 630 to generate a multiple-bit digital noise signal 658, which is highly correlated with the delayed analog noise signal 652. The analog adder 646 adds an input analog signal 654 with the delayed analog noise signal 652 to generate a combined analog signal 656. The quantizer 648 quantizes the combined analog signal 656 to generate a quantized signal 660. The digital adder 650 subtracts the multiple-bit digital noise signal 658 from the quantized signal 660 to generate a digital output signal 662 representing the input analog signal 654.

Figure 7:
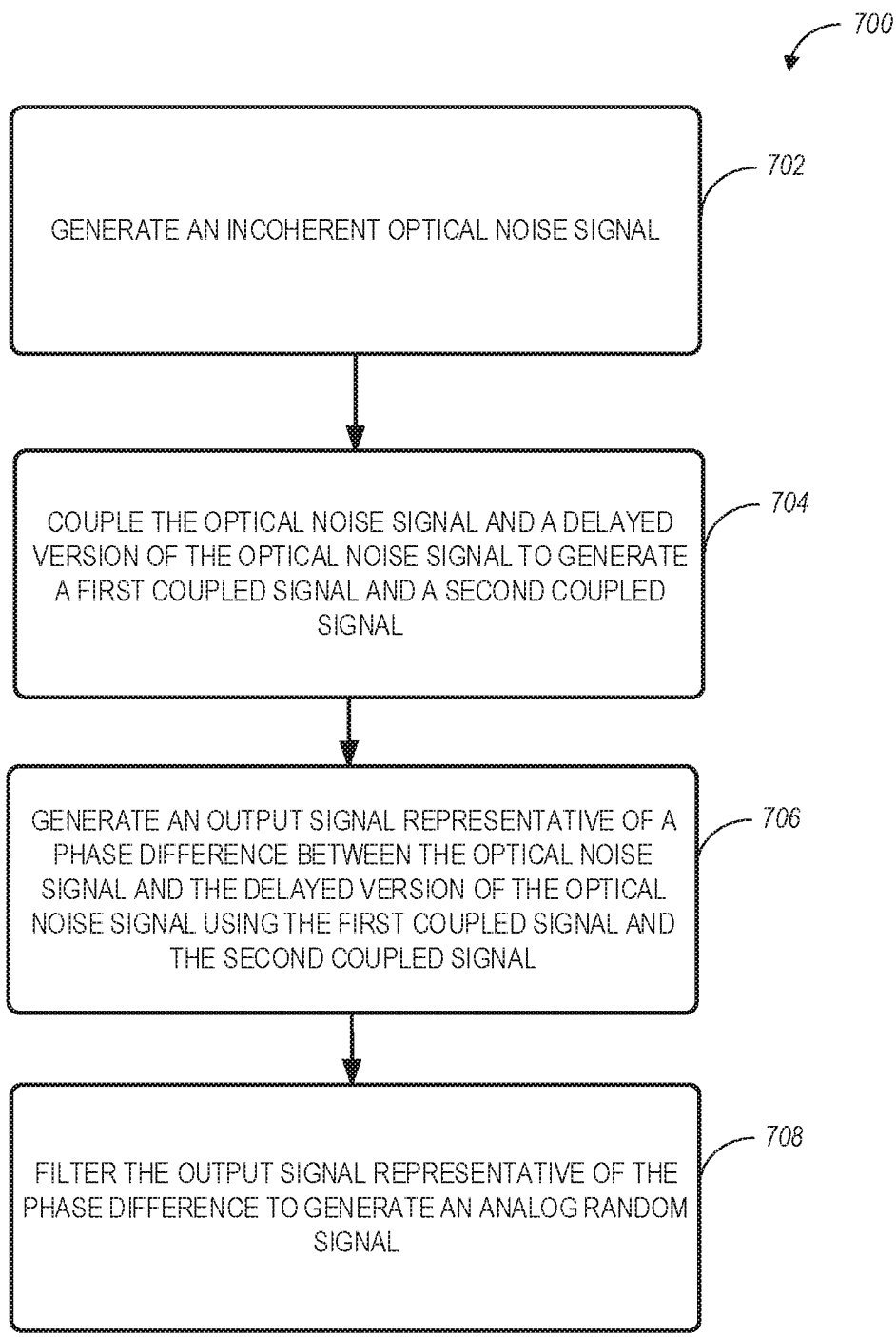
FIG. 7 illustrates generally a flowchart of example functionalities which can be performed in connection with a random signal generation, in accordance with some aspects.

FIG. 7 illustrates generally a flowchart of example functionalities which can be performed in connection with a random signal generation, in accordance with some aspects. Referring to FIG. 7, the method 700 includes operations 702, 704, 706, and 708. By way of example and not limitation, the method 700 is described as being performed by one or more of the components of the photonic RF noise generator 300 of FIG. 3A.

At operation 702, an incoherent optical noise signal is generated. For example, the optical source 302 can generate the optical noise signal 318.

At operation 704, the optical noise signal and its delayed version of the optical noise signal are coupled to generate a first coupled signal and a second coupled signal. For example, the filter 304 can generate a filtered optical noise signal 320 which is split by the splitter 306. One copy of the filtered optical noise signal 320 is communicated to the coupler 310 while the second copy is delayed by the delay circuit 308 to generate a delayed copy. The coupler 310 couples the delayed copy with the filtered optical noise signal 322 to generate a first and second coupled signals 324.

At operation 706, an output signal representative of a phase difference between the optical noise signal and its delayed version is generated using the first coupled signal and the second coupled signal. For example, the BPD 312 generates the output signal 326 that is representative of a phase difference between signals 322 and 320, using the coupled signals 324.

At operation 708, the output signal representative of the phase difference is filtered to generate an analog random signal. For example, filter 314 filters the output signal 326 to generate the analog noise signal 328.

Although an aspect has been described with reference to specific exemplary aspects, it will be evident that various modifications and changes may be made to these aspects without departing from the broader scope of the present disclosure. Accordingly, the specification and drawings are to be regarded in an illustrative rather than a restrictive sense. The accompanying drawings that form a part hereof show, by way of illustration, and not of limitation, specific aspects in which the subject matter may be practiced. The aspects illustrated are described in sufficient detail to enable those skilled in the art to practice the teachings disclosed herein. Other aspects may be utilized and derived therefrom, such that structural and logical substitutions and changes may be made without departing from the scope of this disclosure. This Detailed Description, therefore, is not to be taken in a limiting sense, and the scope of various aspects is defined only by the appended claims, along with the full range of equivalents to which such claims are entitled.

Such aspects of the inventive subject matter may be referred to herein, individually or collectively, merely for convenience and without intending to voluntarily limit the scope of this application to any single aspect or inventive concept if more than one is in fact disclosed. Thus, although specific aspects have been illustrated and described herein, it should be appreciated that any arrangement calculated to achieve the same purpose may be substituted for the specific aspects shown. This disclosure is intended to cover any and all adaptations or variations of various aspects. Combinations of the above aspects and other aspects not specifically described herein will be apparent to those of skill in the art upon reviewing the above description.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed. Description, it can be seen that various features are grouped together in a single aspect for the purpose of streamlining the disclosure. This method of disclosure is not to be interpreted as reflecting an intention that the claimed aspects require more features than are expressly recited in each claim. Rather, as the following claims reflect, inventive subject matter lies in less than all features of a single disclosed aspect. Thus the following claims are hereby incorporated into the Detailed Description, with each claim standing on its own as a separate aspect.

What is claimed is:

1. A photonic random signal generator, comprising:
an incoherent optical source configured to generate an optical noise signal, the optical noise signal comprising random signal phases that are uniformly distributed over a pre-determined range of the optical noise signal;
a coupler configured to receive the optical noise signal and a delayed version of the optical noise signal and couple the received optical noise signal and the delayed version of the optical noise signal to generate a first coupled signal and a second coupled signal, the first and second coupled signals having a spur free dynamic range (SFDR) based on the uniformly distributed random signal phases of the optical noise signal;
a photodetector configured to generate an output signal representative of a phase difference between the optical noise signal and the delayed version of the optical noise signal using the first coupled signal and the second coupled signal;
a filter configured to filter the output signal representative of the phase difference to generate an analog random signal;
a limiter configured to limit the analog random signal based on a clock signal, to generate a binary digital random signal;

a delay circuit configured to receive the analog random signal and generate a delayed analog random signal;
a quantizer configured to generate a quantized signal based on an analog combined signal, the analog combined signal based on an input analog signal and the delayed analog random signal; and
a digital subtractor configured to generate an output digital signal corresponding to the input analog signal, based on the quantized signal and a multiple bit binary noise signal, wherein the multiple bit binary noise signal corresponds to the binary digital random signal.

2. The photonic random signal generator of claim 1, wherein the incoherent optical source is a white light emitting diode (LED) source or an amplified spontaneous emissions (ASE) light source with a bandwidth exceeding a bandwidth of a signal of interest.

3. The photonic random signal generator of claim 1, further comprising:
a second filter configured to generate a filtered optical noise signal using the optical noise signal,
wherein the coupler is configured to couple the filtered optical noise signal and a delayed version of the filtered optical noise signal to generate the first coupled signal and the second coupled signal.

4. The photonic random signal generator of claim 3, wherein the filtered optical noise signal comprises a bandwidth exceeding a bandwidth of a signal of interest.

5. The photonic random signal generator of claim 3, further comprising:
a second delay circuit configured to delay a version of the filtered optical noise signal to generate the delayed version of the filtered optical noise signal.

6. The photonic random signal generator of claim 1, wherein to generate the binary digital random signal, the limiter is configured to:
perform a comparison of the analog random signal to a set value at time instances determined by the clock signal; and
output a digital value for the binary digital random signal based on the comparison.

7. The photonic random signal generator of claim 1, further comprising:
an adder configured to add the input analog signal and the delayed analog random signal to generate the analog combined signal.

8. A photonic random signal generator, comprising:
an incoherent optical source configured to generate an optical noise signal;
a coupler configured to couple the optical noise signal and a delayed version of the optical noise signal to generate a first coupled signal and a second coupled signal;
a photodetector configured to generate an output signal representative of a phase difference between the optical noise signal and the delayed version of the optical noise signal using the first coupled signal and the second coupled signal;
a filter configured to filter the output signal representative of the phase difference to generate an analog random signal;
a limiter configured to limit the analog random signal based on a clock signal, to generate a binary digital random signal;
a delay circuit configured to receive the analog random signal and generate a delayed analog random signal;
a quantizer configured to generate a quantized signal based on an analog combined signal, the analog combined signal based on an input analog signal and the delayed analog random signal; and
a digital subtractor configured to generate an output digital signal corresponding to the input analog signal, based on the quantized signal and a multiple bit binary noise signal,
wherein the multiple bit binary noise signal corresponds to the binary digital random signal.

9. A method for generating random signals, the method comprising:
generating an optical noise signal, the optical noise signal comprising random signal phases that are uniformly distributed over a pre-determined range of the optical noise signal;
coupling the optical noise signal and a delayed version of the optical noise signal to generate a first coupled signal and a second coupled signal, the first and second coupled signals having a spur free dynamic range (SFDR) based on the uniformly distributed random signal phases of the optical noise signal;
generating an output signal representative of a phase difference between the optical noise signal and the delayed version of the optical noise signal using the first coupled signal and the second coupled signal;
filtering the output signal representative of the phase difference to generate an analog random signal;
limiting the analog random signal based on a clock signal, to generate a binary digital random signal;
generating a delayed analog random signal based on the analog random signal;
generating a quantized signal based on an analog combined signal, the analog combined signal based on an input analog signal and the delayed analog random signal; and
generating an output digital signal corresponding to the input analog signal, based on the quantized signal and a multiple bit binary noise signal, wherein the multiple bit binary noise signal corresponds to the binary digital random signal.

10. The method of claim 9, further comprising:
generating a filtered optical noise signal using the optical noise signal.

11. The method of claim 10, wherein the coupling comprises:
coupling the filtered optical noise signal and a delayed version of the filtered optical noise signal to generate the first coupled signal and the second coupled signal.

12. The method of claim 10, wherein the filtered optical noise signal comprises a bandwidth exceeding a bandwidth of a signal of interest.

13. The method of claim 11, further comprising:
delaying a version of the filtered optical noise signal to generate the delayed version of the filtered optical noise signal.

14. The method of claim 9, wherein generating the binary digital random signal comprises:
performing a comparison of the analog random signal to 0 at time instances determined by the clock signal; and
outputting a digital value for the binary digital random signal based on the comparison.

15. A photonic random signal generator, comprising:
an incoherent optical source configured to generate an optical noise signal, the optical noise signal comprising random signal phases that are uniformly distributed over a pre-determined range of the optical noise signal;
a first filter configured to generate a filtered optical noise signal using the optical noise signal;

a coupler configured to receive the filtered optical noise signal and a delayed version of the filtered optical noise signal and couple the received filtered optical noise signal and the delayed version of the filtered optical noise signal to generate a first coupled signal and a second coupled signal, the first and second coupled signals having a spur free dynamic range (SFDR) based on the uniformly distributed random signal phases of the optical noise signal;

a photodetector configured to generate an output signal representative of a phase difference between the filtered optical noise signal and the delayed version of the filtered optical noise signal using the first coupled signal and the second coupled signal;

a second filter configured to filter the output signal representative of the phase difference to generate an analog random signal;

a limiter configured to threshold the analog random signal based on a clock signal, to generate a digital random signal;

a delay circuit configured to receive the analog random signal and generate a delayed analog random signal;

a quantizer configured to generate a quantized signal based on an analog combined signal, the analog combined signal based on an input analog signal and the delayed analog random signal; and a digital subtractor configured to generate an output digital signal corresponding to the input analog signal, based on the quantized signal and a multiple bit binary noise signal, wherein the multiple bit binary noise signal corresponds to the binary digital random signal.

16. The photonic random signal generator of claim 15, wherein the incoherent optical source is a white light emitting diode (LED) source or an amplified spontaneous emissions (ASE) light source with a bandwidth exceeding a bandwidth of a signal of interest.

17. The photonic random signal generator of claim 15, wherein the filtered optical noise signal comprises a bandwidth exceeding a bandwidth of a signal of interest.

18. The photonic random signal generator of claim 15, further comprising:

a second delay circuit configured to delay a version of the filtered optical noise signal to generate the delayed version of the filtered optical noise signal.

* * * * *

UNITED STATES PATENT AND TRADEMARK OFFICE
CERTIFICATE OF CORRECTION

PATENT NO. : 11,216,251 B2
APPLICATION NO. : 16/359248
DATED : January 4, 2022
INVENTOR(S) : Shamee et al.

It is certified that error appears in the above-identified patent and that said Letters Patent is hereby corrected as shown below:

In the Specification

In Column 3, Line 51, after "90°", insert --)--

In Column 4, Line 9, delete "RE" and insert --RF-- therefor

In Column 4, Line 33, delete "RE" and insert --RF-- therefor

In Column 5, Line 51, delete "322" and insert --320-- therefor

In Column 6, Line 31, delete "Detailed." and insert --Detailed-- therefor

In the Claims

In Column 8, Line 24, in Claim 9, delete "thesecond" and insert --the second-- therefor Signed and Sealed this
Twelfth Day of April, 2022

Drew Hirshfeld
*Performing the Functions and Duties of the
Under Secretary of Commerce for Intellectual Property and
Director of the United States Patent and Trademark Office*